United States Patent [19]

Müller et al.

[11] Patent Number: 4,590,428

[45] Date of Patent: May 20, 1986

[54] ELECTROMAGNET FOR NMR TOMOGRAPHY

[75] Inventors: Wolfgang Müller, Karlsruhe; Bertold Knüttel, Rheinstetten, both of Fed. Rep. of Germany

[73] Assignee: Bruker Analytische Messtechnik GmbH, Rheinstetten-Forchheim, Fed. Rep. of Germany

[21] Appl. No.: 559,868

[22] Filed: Dec. 8, 1983

[30] Foreign Application Priority Data

Dec. 11, 1982 [DE] Fed. Rep. of Germany ....... 3245945

[51] Int. Cl.$^4$ .................................... G01R 33/20
[52] U.S. Cl. ................................ 324/320; 324/315
[58] Field of Search ............... 324/300, 318, 319, 315, 324/320, 322; 335/216

[56] References Cited

U.S. PATENT DOCUMENTS

| | | | |
|---|---|---|---|
| 3,569,823 | 3/1971 | Golay | 324/320 |
| 4,429,277 | 1/1984 | Sugimoto | 324/309 |
| 4,467,282 | 8/1984 | Siebold | 324/309 |
| 4,490,675 | 12/1984 | Knuettel | 324/319 |

FOREIGN PATENT DOCUMENTS 2014737 8/1979 United Kingdom .

Primary Examiner—Michael J. Tokar
Attorney, Agent, or Firm—Burmeister, York, Palmatier, Hamby & Jones

[57] ABSTRACT

An electromagnet for generating the constant magnetic field required in NMR tomography includes a superconductive coil system consisting of at least one circular cylindrical field coil (1) and at least one correction coil (2, 3) concentric with the field coil. The coil system is enclosed in a ferromagnetic cylindrical shell (13) whose influence on the homogeneity of the magnetic field is compensated by the particular dimensioning of the field and correction coils. The magnetic field is produced by the coil system (1, 2, 3) in the interior space defined by it, which space is accessible and suitable to receive the body presented for examination. The cylindrical shell (13) may be closed at its ends by ring-shaped ferromagnetic plates (14). The cylindrical shell (13), complete with plates (14), may directly form the exterior wall of the Dewar.

15 Claims, 2 Drawing Figures

ELECTROMAGNET FOR NMR TOMOGRAPHY

FIELD OF THE INVENTION

This invention relates to an electromagnet for generating the constant magnetic field required in NMR tomography.

BACKGROUND OF THE INVENTION

The electromagnet includes a coil system consisting of at least one circular cylindrical field coil and at least one correction coil concentric with the field coil. The coil system is enclosed in a ferromagnetic cylindrical shell whose influence on the homogeneity of the magnetic field is compensated by the particular dimensioning of the field and correction coils. The magnetic field is produced by the coil system in the interior space defined by it which space is accessible and suitable to accommodate an organic body for examination.

An electromagnet of the foregoing type is the object of the invention disclosed in U.S. patent application Ser. No. 386,981, now U.S. Pat. No. 4,490,675, issued Dec. 25, 1984. This earlier electromagnet utilizes a resistive coil system.

SUMMARY OF THE INVENTION

The object of the present invention is to provide a coil system which is superconductive. A further object is that the ferromagnetic cylindrical shell surrounds a Dewar in which the coil system is embedded.

It has been found that the advantages inherent in a ferromagnetic cylindrical shell are fully retained when the cylindrical shell is arranged to surround the Dewar container of a cryogenic magnet. Such advantages reside in the shielding from disturbing external magnetic fields and the limitation of the magnetic field produced by the electromagnet and, in tomography, of the high frequency fields being generated, to the region enclosed by the cylindrical shell. As in the resistive electromagnet, the recursion of the magnetic flux through the ferromagnetic cylindrical shell permits also in the cryogenic magnet a reduction in the size of the coil system, so that the space requirements for electromagnets of this type are considerably less than for conventional cryogenic or superconductive magnets. In NMR tomography, the use of a cryogenic, or superconductive, magnet, as opposed to a resistive electromagnet, has the special advantage that the temperature constancy of a superconductive magnet permits the development of an especially stable and thus homogeneous magnetic field.

A particularly compact construction of the electromagnet having a superconductive coil system according to the invention is obtained in that the cylindrical shell itself forms the exterior wall of the Dewar.

The effectiveness of the cylindrical shell as a shield and a magnetic flux recursion medium may further be enhanced in that, according to one embodiment, the cylindrical shell is closed at its ends by ring-shaped or annular ferromagnetic plates which cover the front faces of the Dewar. It will be appreciated that such ring-shaped ferromagnetic plates are capable of influencing the configuration of the magnetic field generated by the coil assembly and should therefore be taken into account when dimensioning the coil system.

NMR tomography requires gradient fields of considerable strength which must be capable of being very quickly turned on and off. The resulting field changes tend to give rise to the occurrence of eddy currents in the cylindrical shell. To keep such eddy currents small, it is advantageous to construct the cylindrical shell, and perhaps also the ferromagnetic plates, of a material having a high permeability and at the same time a high electrical resistivity. Special iron grades are commercially available for this particular purpose. In addition, the cylindrical shell may be provided with a slot or a plurality of slots in the axial direction in order to prevent the occurrence of closed loop currents. For example, the cylindrical shell may be constructed of a plurality of parallel axially extending rods. It is also of advantage to provide the cylindrical shell with a transversely directed slot or a plurality of such transverse slots. In particular, the cylindrical shell may be constructed of a plurality of axially serially disposed annular discs or rings. In this manner, the occurrence of eddy currents having a pronounced axial component is prevented. With the selection of a suitable material and of the proper wall thickness of the cylindrical shell, any interruption of the magnetic circle by the air gaps between the annular discs or rings is of little consequence. A combination of axial and transverse slotting may be achieved by providing the rings or annular discs with at least one radial slot. More than one radial slot will result in a division of the annular discs into sectors.

A problem specific to cryogenic magnets is connected with the use of liquid helium and liquid nitrogen requisite to obtain cryogenic temperatures. Since the cryogenic magnet of the present invention is intended for constant operation, it is of the utmost importance that the consumption of liquid helium and liquid nitrogen be kept to the lowest possible quantities. It is accordingly a further object of the invention to provide the Dewar of the electromagnet with shielding means to which a cooling system is connected. Such shield can be maintained at very low temperatures by the cooling system and is effective to considerably lower the evaporation rate of the cryogenic liquids.

Both the containers holding the liquid cooling agents and the shielding means disposed inside the Dewar must have a good thermal conductivity so that any heat generated inside the Dewar can be quickly carried off to avoid any localized heating up of the Dewar. Materials having a good thermal conductivity usually also have a good electrical conductivity. However, as in the magnet shell, eddy currents may occur also in electrically conductive container walls and shields. The ensuing difficulties can be avoided according to another object of the invention in that the Dewar and/or cooling vessels, shields and the like, enclosed in the Dewar, are made at least in part of materials which are poor electrical conductors but which, if desired, may have embedded therein inserts of materials having a good thermal conductivity. Such materials, notably glass fiber reinforced plastics, for example, are electrically nonconductive as well as nonmagnetic so that they will not interfere with the functioning of the magnet. In particular, structural plastic parts are not susceptible to the occurrence of eddy currents. The lack of thermal conductivity in plastic can be compensated for by the previously mentioned insertion of heat conductive materials, such as copper, for example, which may be so placed and sectioned as to maximize the prevention of eddy currents.

The invention will be described in further detail with reference to the embodiments illustrated in the drawings. The particular features illustrated in the drawings

DETAILED DESCRIPTION OF ILLUSTRATIVE EMBODIMENTS

Figure 1:
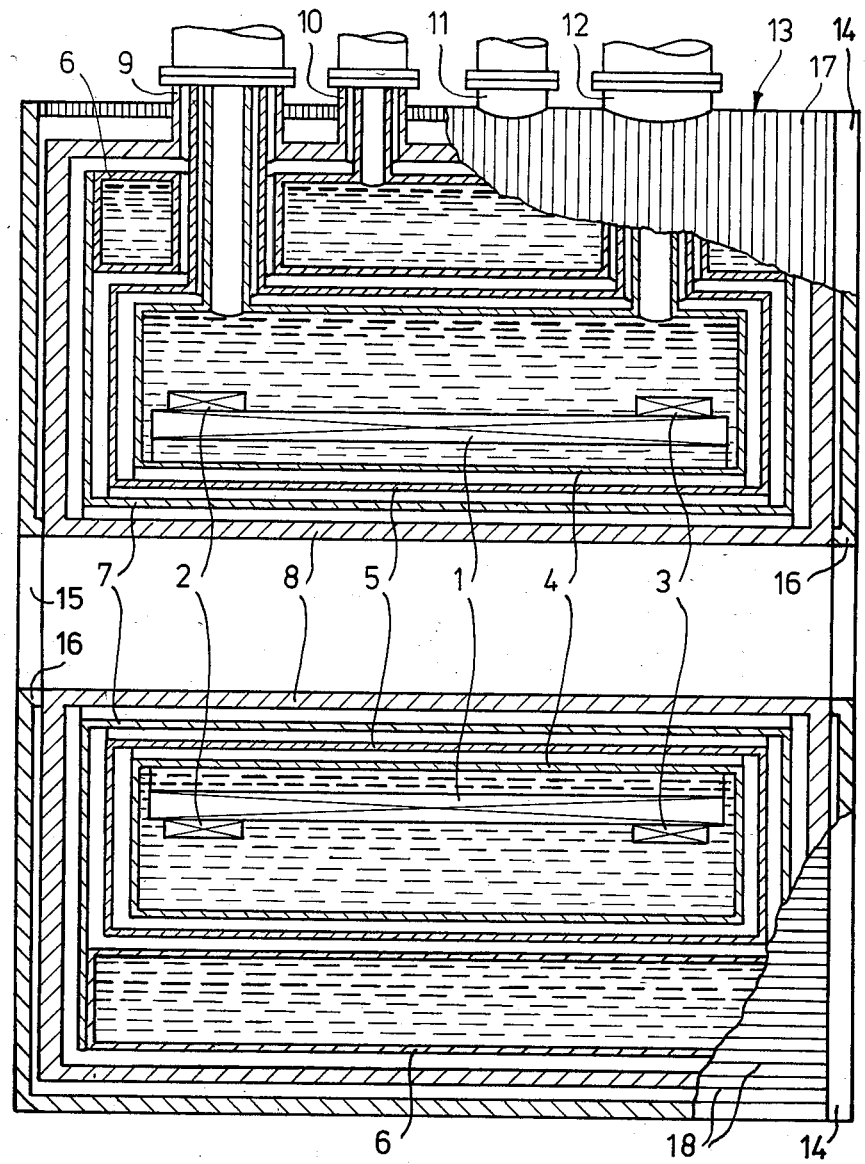
FIG. 1 is a longitudinal sectional view of a first embodiment of a superconductive electromagnet according to the invention.

The superconductive magnet illustrated in FIG. 1 includes a field coil 1 with error or correction coils 2 and 3 secured to its ends and concentrically surrounding the field coil 1. The coils 1 to 3 are disposed, in a manner not shown in detail because it is conventional in the art of superconductive magnets (which are referred herein sometimes also as "cryogenic magnets"), in a cylindrical container 4 which is in the form of a double walled pipe section and is filled with liquid helium. Surrounding the container 4 with a space therebetween is a gas cooled shield structure 5. Positioned at the exterior side of the shield 5 is another tubular container 6 which is filled with liquid nitrogen. Issuing from the front face of the container 6 is a nitrogen shield structure 7 which extends at a distance past the ends of the gas cooled shield 5 and surrounds also the inner surface of the gas cooled shield 5. Finally, the entire assembly is enclosed in a nonmagnetic Dewar 8. The individual containers and spaces between the container walls and the shields or the Dewar, respectively, are connectible to supply and discharge pipes for helium, nitrogen and cooling gases by means of radially disposed pipe connectors 9, 10, 11 and 12.

In accordance with the invention, the entire superconductive magnet described up to now is surrounded by a ferromagnetic shield which consists of a cylindrical shell 13 and ring-shaped or annular plates 14 disposed at each end of the cylindrical shell. The diameter of the center opening 15 of the ring-shaped plates 14 is equal to the inner diameter of the tubular Dewar 8. A flange or collet 16 provided at the edge of the opening 15 bears against the exterior wall of the Dewar 8.

In order to suppress potential eddy currents, the ferromagnetic shield structure 13, 14 is made of an iron grade that has a high degree of permeability and a low degree of electric conductivity, as for example alloys of hyperpure iron and 1 to 4% silicon, and similar iron alloys as used for laminated transformer cores (see S. Cedighian "Die magnetischen Werkstoffe", VDI-Verlag, 1967, page 201, FIG. 6.11). Moreover, as will be seen from the upper half of FIG. 1, the cylindrical shell 13 may be constructed of individual annular discs or rings 17, affording a plurality of transverse slots by which the formation of axially directed eddy currents is prevented. The cylindrical shell 13 may also be constructed of a plurality of axially extending rods 18, as it is shown in the lower half of FIG. 1. This will prevent the occurrence of eddy currents along the circumference of the cylindrical shell 13. A combination of transverse and axial slotting may be obtained by using annular discs or rings for the construction of the cylindrical shell, which annular discs have an axial slot or are divided into sectors. From such slotted rings or sectors it is possible to readily assemble ferromagnetic cylindrical shells of high stability. The previously mentioned connecting pipes 9 to 12 extend through the wall of the ferromagnetic cylinder 13.

Figure 2:
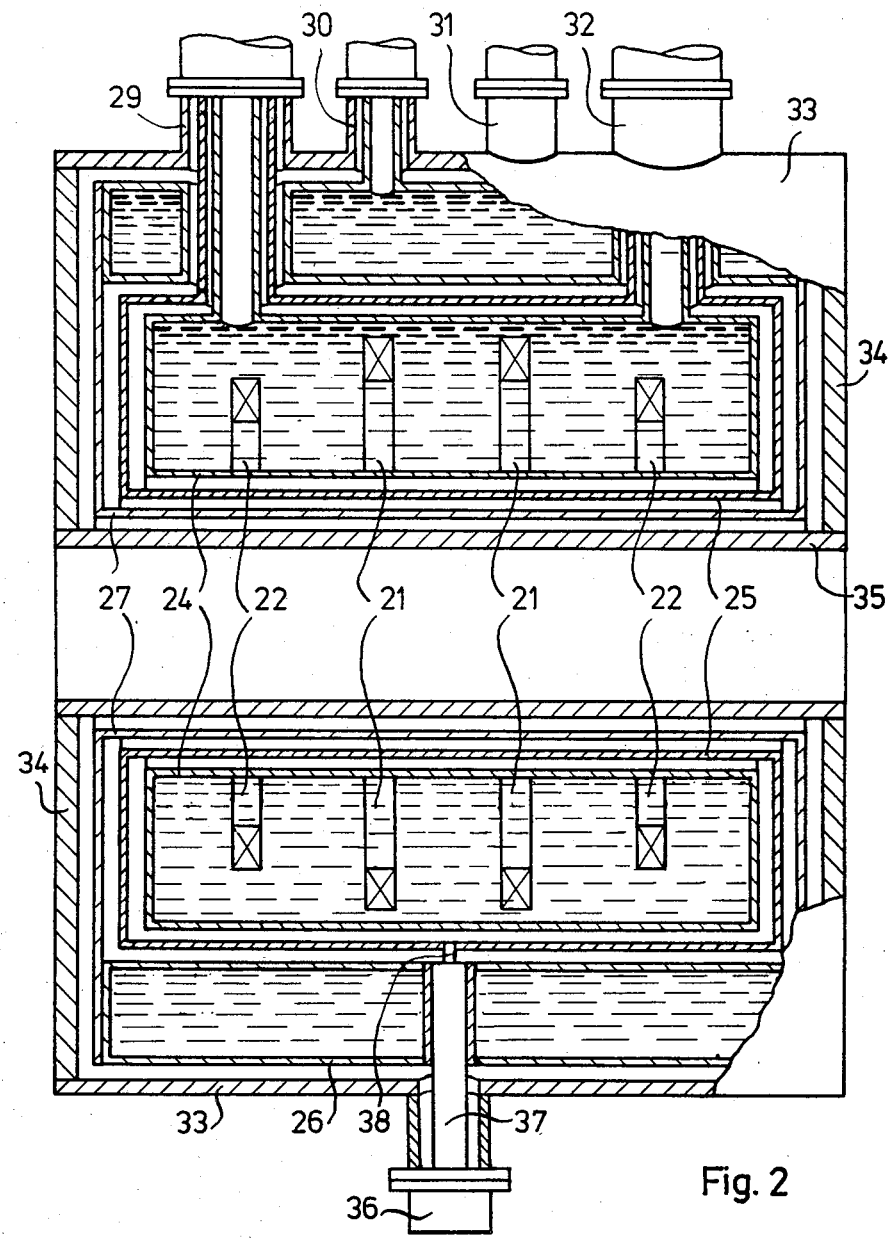
FIG. 2 is a longitudinal sectional view of another embodiment of the magnet according to the invention.

The embodiment illustrated in FIG. 2 is distinguished from the embodiment of FIG. 1 by a different coil system, on the one hand, and by using the ferromagnetic shield directly as the exterior wall of the Dewar, on the other hand. While the embodiment of FIG. 1 utilizes a coil system which may be roughly considered the equivalent of a modified Garrett assembly (see Journal of Applied Physics, Vol. 40, No. 8, July 1969, pages 3171 to 3179), the coil system used in the embodiment of FIG. 2 is of the type of a modified Helmholtz double coil. This system comprises four coils axially disposed in tandem, of which the two inner coils 21 have a diameter which exceeds the diameter of the two outer coils 22. Similar to the embodiment of FIG. 1, the coil system of the embodiment of FIG. 2 is so dimensioned as to produce a homogeneous magnetic field in the space defined by the coil system and the ferromagnetic enclosure. Also in this embodiment, the coil system is disposed in a container 24 filled with liquid helium. The container 24 is surrounded by a gas cooled shield 25, leaving a space therebetween. Outwardly adjacent the shield 25 is a container 26 filled with liquid nitrogen and a nitrogen shield 27 surrounding the gas cooled shield 25 also at the inner cylinder surface. Instead of a separate Dewar, this embodiment is directly enclosed in the ferromagnetic cylinder 33, with the exterior sections of the pipe connectors 29, 30, 31 and 32 being integrally formed thereon. Again, the cylindrical shell 33 is closed at its ends by annular ferromagnetic plates 34 which extend past the inner diameter of the nitrogen shield 27. Mounted in the openings of the ring-shaped plates 34 is a center tube 35 which is made of a nonmagnetic material and which constitutes the space available for the object presented for examination. Also in this embodiment, the cylindrical shell 33 and the ring-shaped plates 34 are made of a highly permeable material having a low electrical conductivity. The cylindrical shell 33 again may be slotted. If desired, the plates at the ends of the cylindrical shell may be built up of rings or sectors in order to suppress also in this region the occurrence of eddy currents as far as possible. However, if the magnetic shield serves directly as the exterior wall of the Dewar, as it is the case in the instant embodiment, it may be more expedient to use a solid cylindrical shell 33 and solid annular plates 34 so as to avoid potentially difficult sealing problems.

The superconductive magnet illustrated in FIG. 2 is additionally provided with a cooling system 36 which is in thermal contact, by way of cooled elements or fingers 37 and 38, with the wall of the container 26 filled with liquid nitrogen and with the gas cooled shield structure 25. Due to the cooling system, it is possible to remove a substantial portion of the heat entering the system from the outside. Consequently, by using a cooling system of this type, a significant reduction in the consumption of liquid helium, liquid nitrogen or other cryogenic liquids can be achieved.

Conventionally, a Dewar and the vessels and shields installed in the Dewar are made of metal because of its high thermal conductivity which is necessary to keep the heat gradients small inside the Dewar. On the other hand, eddy currents may also occur in the walls of metal containers and shields and not only cause loss of energy, but may also cause the development of heat inside the Dewar. It is therefore necessary to keep eddy currents, generated by the shifting of the field gradients, to a minimum also inside the cryogenic container. For this purpose, the elements of the Dewar disposed within the magnetic shield, the cooling vessels and the shield structures are made of a material of poor electrical conductivity, such as glassfiber reinforced plastic, for example. In order not to impair a good thermal conductivity which is necessary, the plastic parts may have embedded therein metal inserts which are so constructed and arranged as not to form short circuit paths for eddy currents while nevertheless affording the desirable good heat conductivity.

It will be appreciated that the invention is not limited to the illustrated and described embodiments, but that modifications and variations are possible within the scope of the invention. The choice of the particular coil system and the total dimensions of the apparatus will be subject to its particular application and use, notably to the configuration of the objects intended to be examined.

It is conceivable that magnet configurations of the kind described in the previously mentioned U.S. patent application Ser. No. 386.891, now U.S. Pat. No. 4,490,675, issued Dec. 25, 1984, might be considered a good choice because a magnet of this type is capable of being operated in the horizontal as well as the vertical direction.

We claim:

1. An electromagnet for producing a constant magnetic field as required for use in NMR tomography of a body to be examined,
    the electromagnet including a coil system having an axial interior space therein for receiving the body to be examined,
    the coil system including at least one circular cylindrical field coil and at least one correction coil coaxial with the field coil,
    the field coil and the correction coil being dimensioned and positioned to produce a substantially homogeneous magnetic field in the interior space,
    the coil system being superconductive and having a cryogenic coling system including a Dewar container surrounding the coil system,
    and a ferromagnetic cylindrical shell surrounding the Dewar container and affording a return magnetic path and a magnetic shield for the coil system while affording shielding for the Dewar container.

2. An electromagnet according to claim 1, in which the ferromagnetic cylindrical shell itself forms the exterior wall of the Dewar container.

3. An electromagnet according to claim 1, including a pair of ring-shaped ferromagnetic end plates mounted on the opposite ends of the ferromagnetic cylindrical shell and projecting inwardly therefrom for enclosing the corresponding end portions of the coil system and the Dewar container.

4. An electromagnet according to claim 1, in which the ferromagnetic cylindrical shell is made of a material having a high permeability and a high electrical resistivity.

5. An electromagnet according to claim 1, in which the ferromagnetic cylindrical shell is provided with at least one slot therein extending in an axial direction for interrupting circumferential eddy current flow in the shell.

6. An electromagnet according to claim 1, in which the ferromagnetic cylindrical shell is provided with at least one transversely directed slot for interrupting eddy current flow.

7. An electromagnet for producing a constant magnetic field as required for use in NMR tomography of a body to be examined,
    the electromagnet including a coil system having an axial interior space therein for receiving the body to be examined,
    the coil system including at least one circular cylindrical field coil and at least one correction coil coaxial with the field coil,
    the field coil and the correction coil being dimensioned and positioned to produce a substantially homogeneous magnetic field in the interior space,
    the coil system being superconductive and having a cryogenic cooling system including a Dewar container surrounding the coil system,
    and a ferromagnetic cylindrical shell surrounding the Dewar container and affording a return magnetic path and a magnetic shield for the coil system while affording shielding for the Dewar container,
    the ferromagnetic cylindrical shell being constructed of a plurality of parallel axially extending rods with axially extending slots therebetween to interrupt eddy current flow.

8. An electromagnet for producing a constant magnetic field as required for use in NMR tomography of a body to be examined,
    the electromagnet including a coil system having an axial interior space therein for receiving the body to be examined,
    the coil system including at least one circular cylindrical field coil and at least one correction coil coaxial with the field coil,
    the field coil and the correction coil being dimensioned and positioned to produce a substantially homogeneous magnetic field in the interior space,
    the coil system being superconductive and having a cryogenic cooling system including a Dewar container surrounding the coil system,
    and a ferromagnetic cylindrical shell surrounding the Dewar container and affording a return magnetic path and a magnetic shield for the coil system while affording shielding for the Dewar container,
    the ferromagnetic cylindrical shell being constructed of a series of axially disposed ring-shaped discs with transversely directed slots therebetween to interrupt eddy current flow.

9. An electromagnet according to claim 8, in which the ring-shaped discs are provided with radial slots to interrupt eddy current flow.

10. An electromagnet according to claim 8, in which the ring-shaped discs are subdivided into segments with generally radial slots therebetween to interrupt eddy current flow.

11. An electromagnet for producing a constant magnetic field as required for use in NMR tomography of a body to be examined,
    the electromagnet including a coil system having an axial interior space therein for receiving the body to be examined,
    the coil system including at least one circular cylindrical field coil and at least one correction coil coaxial with the field coil,
    the field coil and the correction coil being dimensioned and positioned to produce a substantially homogeneous magnetic field in the interior space, the coil system being superconductive and having a cryogenic cooling system including a Dewar container surrounding the coil system, and a ferromagnetic cylindrical shell surrounding the Dewar container and affording a return magnetic path and a magnetic shield for the coil system while affording shielding for the Dewar container, the cryogenic cooling system including cooling vessels within the Dewar container, the cooling vessels having walls made at least in part of a wall material having poor electrical conductivity but with inserts of materials having good thermal conductivity embedded in the wall material.

12. An electromagnet according to claim 11, in which the wall material is made of glass fiber reinforced plastic, the inserts being made of metal having good thermal conductivity.

13. An electromagnet for producing a constant magnetic field as required for use in NMR tomography of a body to be examined, the electromagnet including a coil system having an axial interior space therein for receiving the body to be examined, the coil system including at least one circular cylindrical field coil and at least one correction coil coaxial with the field coil, the field coil and the correction coil being dimensioned and positioned to produce a substantially homogeneous magnetic field in the interior space, the coil system being superconductive and having a cryogenic cooling system including a Dewar container surrounding the coil system, the cryogenic cooling system having cooling vessels within the Dewar container, the vessels having walls made at least in part of a wall material having a poor electrical conductivity but with inserts having a good thermal conductivity embedded in the wall material, the wall material inhibiting eddy current flow.

14. An electromagnet according to claim 13, in which the wall material is made of glass fiber reinforced plastic, the inserts being made of metal having high heat conductivity.

15. An electromagnet according to claim 1, including means for circulating a coolant immediately within the ferromagnetic cylindrical shell.

* * * * *

UNITED STATES PATENT AND TRADEMARK OFFICE
CERTIFICATE OF CORRECTION

PATENT NO. : 4,590,428
DATED : May 20, 1986
INVENTOR(S) : Wolfgang Müller, Bertold Knüttel and Günther Laukien It is certified that error appears in the above-identified patent and that said Letters Patent are hereby corrected as shown below:

The third inventor is added to the title page,

Günther Laukien, Rheinstetten, Federal Republic of Germany.

Signed and Sealed this

Twenty-first Day of October, 1986

[SEAL]

Attest:

DONALD J. QUIGG

Attesting Officer     Commissioner of Patents and Trademarks